(12) United States Patent
Lin et al.

(10) Patent No.: US 11,222,887 B2
(45) Date of Patent: Jan. 11, 2022

(54) TRANSIENT VOLTAGE SUPPRESSION DEVICE

(71) Applicant: IPU SEMICONDUCTOR CO., LTD., Miaoli County (TW)

(72) Inventors: Cheng-Chi Lin, Hsinchu County (TW); Chih-Hao Chen, Hsinchu County (TW)

(73) Assignee: IPU SEMICONDUCTOR CO., LTD., Miaoli County (TW)

( * ) Notice: Subject to any disclaimer, the term of this patent is extended or adjusted under 35 U.S.C. 154(b) by 0 days.

(21) Appl. No.: 16/910,094

(22) Filed: Jun. 24, 2020

(65) Prior Publication Data

US 2021/0020625 A1 Jan. 21, 2021

(30) Foreign Application Priority Data

Jul. 16, 2019 (TW) ................................ 108125073

(51) Int. Cl.
*H01L 27/02* (2006.01)
*H01L 29/74* (2006.01)

(52) U.S. Cl.
CPC ...... *H01L 27/0262* (2013.01); *H01L 29/7408* (2013.01)

(58) Field of Classification Search
CPC ............. H01L 27/0262; H01L 29/7408; H01L 29/0603; H01L 29/87; H01L 27/0203; H01L 27/0248; H01L 29/0611; H01L 29/0688; H01L 29/68

See application file for complete search history.

(56) References Cited

U.S. PATENT DOCUMENTS

| | | |
|---|---|---|
| 6,172,404 B1 | 1/2001 | Chen et al. |
| 6,268,639 B1 | 7/2001 | Li et al. |
| 6,268,992 B1 | 7/2001 | Lee et al. |
| 6,696,708 B2 | 2/2004 | Hou et al. |
| 10,062,682 B1 * | 8/2018 | Mallikarjunaswamy ..... H01L 23/535 |

* cited by examiner

*Primary Examiner* — Wasiul Haider
(74) *Attorney, Agent, or Firm* — Li & Cai Intellectual Property Office

(57) ABSTRACT

A transient voltage suppression device including a substrate of a first conductivity type, a first well of a second conductivity type, a first anode, a first cathode, and a first trigger node is provided. The first well is disposed in the substrate. The first anode is disposed in the substrate outside the first well and includes a second doped region of the second conductivity type and a third doped region of the first conductivity type disposed between the second doped region and the first doped region. The first trigger node is disposed between the first anode and the first cathode, and includes a fourth region of the first conductivity type disposed in the substrate and a fifth doped region of the second conductivity type at least partially disposed in the first well and disposed between the fourth doped region and the third doped region.

15 Claims, 16 Drawing Sheets

TRANSIENT VOLTAGE SUPPRESSION DEVICE

CROSS-REFERENCE TO RELATED APPLICATION

This application claims the priority benefit of Taiwan application serial no. 108125073, filed on Jul. 16, 2019. The entirety of the above-mentioned patent application is hereby incorporated by reference herein and made a part of this specification.

BACKGROUND

Technical Field

The disclosure relates to an integrated circuit, and particularly to a transient voltage suppression device.

Description of Related Art

Generally speaking, electronic products are vulnerable to sudden and uncontrollable impact of electrostatic discharge (ESD), which causes the electronic products to be damaged and unable to recover. At present, regarding the issue of electrostatic discharge or surge of electronic products, the use of transient voltage suppressor (TVS) is a more effective solution.

With the advancement of technology, various types of electronic products are developing toward the trend of having high speed, high efficiency, and being light, thin, and short. Under such trend, the protection ability of the transient voltage suppressor against the electrostatic discharge and surge is weakened due to the reduction in the size of the device, so the transient voltage suppressor cannot withstand energy with relatively high power. Therefore, how to improve the protection ability of the device against the electrostatic discharge under a limited layout area has become an important topic.

SUMMARY

The disclosure provides a transient voltage suppression device, which can reduce the device area, improve the electrostatic discharge tolerance, adjust the breakdown voltage or trigger voltage, and reduce the junction capacitance.

The disclosure provides a transient voltage suppression device, which includes a substrate of a first conductivity type, a first well of a second conductivity type, a first anode, a first cathode, and a first trigger node. The first well is disposed in the substrate. The first anode is disposed in the substrate outside the first well and includes a first doped region of the second conductivity type. The first cathode is disposed in the first well and includes a second doped region of the second conductivity type and a third doped region of the first conductivity type disposed between the second doped region and the first doped region. The first trigger node is disposed between the first anode and the first cathode, and includes a fourth doped region of the first conductivity type disposed in the substrate and a fifth doped region of the second conductivity type at least partially disposed in the first well and disposed between the fourth doped region and the third doped region.

In an embodiment of the disclosure, the first trigger node is electrically floating.

In an embodiment of the disclosure, the fourth doped region and the fifth doped region are in a same diffusion region and are both adjacent to a surface of the substrate.

In an embodiment of the disclosure, a doping concentration of the fourth doped region is greater than or equal to a doping concentration of the fifth doped region.

In an embodiment of the disclosure, the fourth doped region is partially disposed in the fifth doped region.

In an embodiment of the disclosure, the first cathode further includes a sixth doped region of the first conductivity type, and the second doped region is disposed between the sixth doped region and the third doped region.

In an embodiment of the disclosure, the first cathode further includes a seventh doped region of the second conductivity type, and the seventh doped region is disposed below the second doped region and the third doped region.

In an embodiment of the disclosure, a doping concentration of the seventh doped region is between a doping concentration of the first well and a doping concentration of the second doped region.

In an embodiment of the disclosure, the seventh doped region and the fifth doped region are in contact.

In an embodiment of the disclosure, the seventh doped region and the fifth doped region are separated by a distance.

In an embodiment of the disclosure, the first trigger node further includes a second well of the first conductivity type disposed in the substrate below the fourth doped region.

In an embodiment of the disclosure, the second well and the first well are in contact.

In an embodiment of the disclosure, the second well and the first well are separated by a distance.

In an embodiment of the disclosure, the second doped region and the third doped region are in contact and are at a same potential.

In an embodiment of the disclosure, the transient voltage suppression device is a mirror structure with the first doped region or the second doped region as a central axis.

Based on the above, in the transient voltage suppression device of the disclosure, the doped regions at the cathode are N+/P+/N+ junction structures of the same diffusion region and have the same potential to increase the trigger current. Compared with the conventional structure in which a field oxide layer is used to separate the doped regions at the cathode to different diffusion regions, the area occupied according to the disclosure is relatively small and the electrostatic discharge tolerance can be effectively improved. At the same time, there is a doped region structure below the trigger node to improve the degree of isolation between the anode and the cathode, which can reduce the design area and increase the device density per unit area, thereby effectively reducing the on resistance (Ron) of the device. In addition, the doped region structures of the trigger node are all in the same diffusion region and there is an N/P junction formed by an N doped region and a P doped region. Therefore, the breakdown voltage or the trigger voltage may be adjusted by changing only the doping concentration of the P doped region, which can reduce the design complexity. In addition, the anode is a P+/N-sub junction and due to the low concentration of N-sub, the depletion region between N-sub and P+ is enlarged, which can reduce the junction capacitance.

To make the aforementioned and other features of the disclosure more comprehensible, several embodiments accompanied with drawings are described in detail as follows.

DETAILED DESCRIPTION OF DISCLOSED EMBODIMENTS

Figure 1:
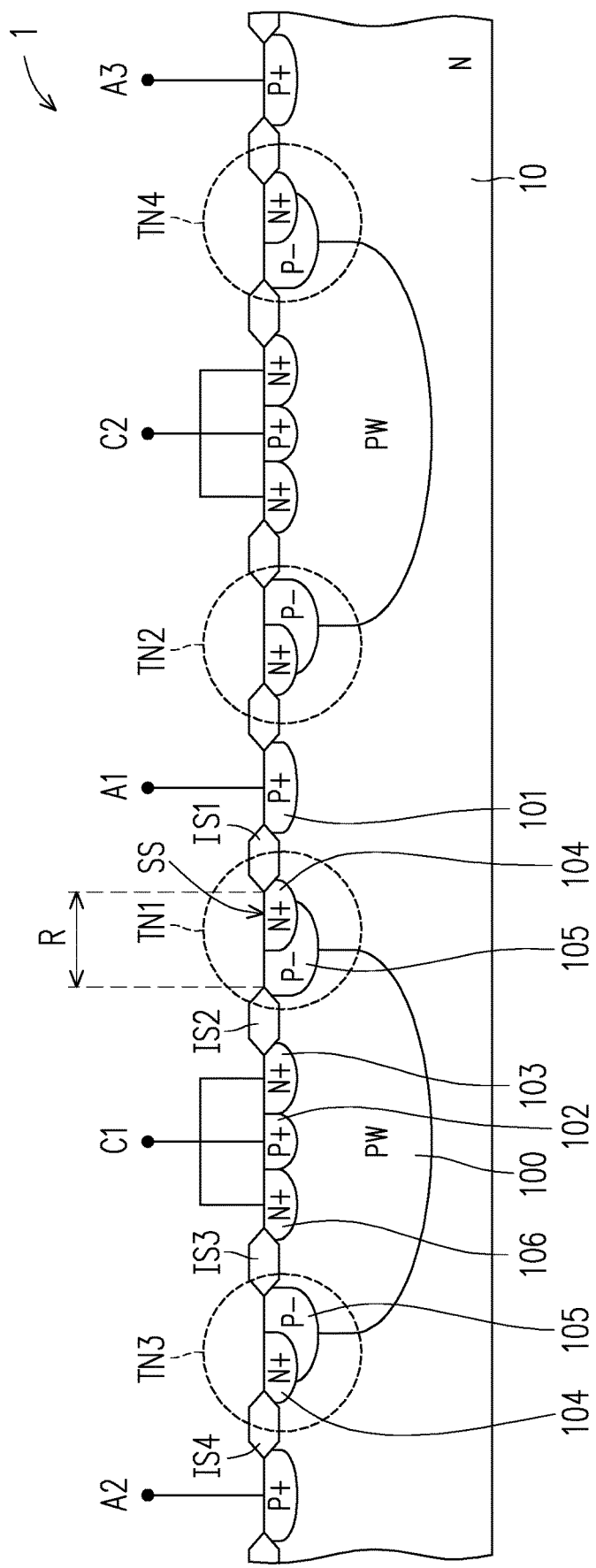
FIG. 1 to FIG. 8 are cross-sectional views of various types of transient voltage suppression devices according to some embodiments of the disclosure.

The disclosure is more comprehensively explained with reference to the drawings of the embodiments. However, the disclosure may also be embodied in various types of different forms and should not be limited to the embodiments herein. The thickness of layers and regions in the drawings are magnified for clarity. The same or similar reference numerals indicate the same or similar devices, which will not be reiterated one by one in the following paragraphs.

In the following embodiments, when a first conductivity type is N-type, a second conductivity type is P-type; and when the first conductivity type is P-type, the second conductivity type is N-type. The present embodiment is exemplified with the first conductivity type as N-type and the second conductivity type as P-type. However, the disclosure is not limited thereto.

FIG. 1 to FIG. 8 are cross-sectional views of various types of transient voltage suppression devices according to some embodiments of the disclosure. The structure of the transient voltage suppression device of FIG. 1 will be described in detail below, and then the differences between the transient voltage suppression devices of FIG. 2 to FIG. 8 and the transient voltage suppression device of FIG. 1 will be described.

Referring to FIG. 1, the disclosure provides a transient voltage suppression device 1, which includes a substrate 10, a first well 100, a first anode A1, a first cathode C1, and a first trigger node TN1.

The substrate 10 includes a semiconductor substrate, a semiconductor compound substrate, or a semiconductor-on-insulator (SOI) substrate. In an embodiment, the substrate 10 is a substrate of the first conductivity type (for example, N-type).

The first well 100 is disposed in the substrate 10. In an embodiment, the first well 100 is a first well of the second conductivity type (for example, P-type).

The first anode A1 is disposed in the substitute 10 outside the first well 100. In an embodiment, the first anode A1 includes a first doped region 101 of the second conductivity type (for example, P-type). The first doped region 101 is a heavy doped region.

The first cathode C1 is disposed in the first well 100. In an embodiment, the first cathode C1 includes a second doped region 102 of the second conductivity type (for example, P-type), a third doped region 103 of the first conductivity type (for example, N-type), and a sixth doped region 106 of the first conductivity type (for example, N-type). The second doped region 102 is disposed between the third doped region 103 and the sixth doped region 106, and the third doped region 103 is disposed between the second doped region 102 and the first doped region 101. The second doped region 102, the third doped region 103, and the sixth doped region 106 are heavy doped regions. In an embodiment, the second doped region 102, the third doped region 103, and the sixth doped region 106 are electrically connected to each other through a metal layer to be at the same potential.

The first trigger node TN1 is disposed between the first anode A1 and the first cathode C1. In an embodiment, the first trigger node TN1 and the first anode A1 are separated from each other by an isolation structure IS1, and the first trigger node TN1 and the first cathode C1 are separated from each other by an isolation structure IS2. In other words, the isolation structure IS1 and the isolation structure IS2 define a diffusion region R where the first trigger node TN1 is located. The isolation structure IS1 and the isolation structure IS2 include field oxide layers, shallow trench isolation structures, or any suitable isolation structures.

In an embodiment, the first trigger node TN1 includes a fourth doped region 104 of the first conductivity type (for example, N-type) and a fifth doped region 105 of the second conductivity type (for example, P-type). The fourth doped region 104 is disposed in the substrate 10. The fifth doped region 105 is disposed in the first well 100 and is disposed between the fourth doped region 104 and the third doped region 103. The fourth doped region and the fifth doped region are in the same diffusion region R and are both adjacent to a surface SS of the substrate 10.

In an embodiment, a portion of the fourth doped region 104 is disposed in the fifth doped region 105. In other words, the fifth doped region 105 further extends below the fourth doped region 10. In an embodiment, a doping concentration of the fourth doped region 104 is greater than a doping concentration of the fifth doped region 105. The fourth doped region 104 is a heavy doped region, the fifth doped region 105 is a light doped region, and the fourth doped region 104 and the fifth doped region 105 are in contact. In an embodiment, the first trigger node TN1 is electrically floating.

In an embodiment, the transient voltage suppression device 1 further includes a second trigger node TN2, and the second trigger node TN2 and the first trigger node TN1 are mirror-symmetrical with the first anode A1 as the center.

In an embodiment, the transient voltage suppression device 1 further includes a third trigger node TN3, and the third trigger node TN3 and the first trigger node TN1 are mirror-symmetrical with the first cathode C1 as the center. In an embodiment, the third trigger node TN3 and the first cathode C1 are separated from each other by an isolation structure IS3. The isolation structure IS3 includes a field oxide layer, a shallow trench isolation structure, or any suitable isolation structure.

In an embodiment, the transient voltage suppression device 1 further includes a second anode A2, and the second anode A2 and the first anode A1 are mirror-symmetrical with the first cathode C1 as the center. In an embodiment, the second anode A2 and the third trigger node TN3 are separated from each other by an isolation structure IS4. The isolation structure IS4 includes a field oxide layer, a shallow trench isolation structure, or any suitable isolation structure.

In an embodiment, the transient voltage suppression device 1 further includes a second cathode C2, and the second cathode C2 and the first cathode C1 are mirror-symmetrical with the first anode A1 as the center.

In an embodiment, the transient voltage suppression device 1 further includes a fourth trigger node TN4, and the fourth trigger node TN4 and the second trigger node TN2 are mirror-symmetrical with the second cathode C2 as the center.

In an embodiment, the transient voltage suppression device 1 further includes a third anode A3, and the third anode A3 and the second anode A2 are mirror-symmetrical with the second cathode C2 as the center.

Based on the above, the transient voltage suppression device 1 is a mirror structure with the first doped region 101 as the central axis. More specifically, components (such as doped regions) on both sides of the first doped region 101 may continue to be arranged on both sides according to the above rule as required.

In the transient voltage suppression device 1, the first anode A1 has a P+/N junction composed of the first doped region 101 (such as P+ doped region) and the substrate 10 (such as N-type substrate). Due to the low doping concentration of the N-type substrate 10, a depletion region between the N-type substrate 10 and the first doped region 101 (such as P+ doped region) is enlarged, which can reduce the junction capacitance.

In addition, the fourth doped region 104 (such as N+ doped region) of the first trigger node TN1 may improve the degree of isolation between the first anode A1 (such as P+ doped region) and the first well 100 (such as P-type well) to prevent the punch through phenomenon between the first well 100 and the first anode A1 while reducing the device area. Furthermore, the fourth doped region 104 (such as N+ doped region) and the fifth doped region 105 (such as P− doped region) of the first trigger node TN1 are both exposed from the surface of the substrate 10. In other words, from a top view, two types of doped regions, N+/P, may be seen at the first trigger node TN1. Such structure is more stable than the overlapping structure of doped regions according to the prior art.

The second doped region 102 (such as P+ doped region), the third doped region 103 (such as N+ doped region), and the sixth doped region 106 (such as N+ doped region) of the first cathode C1 are electrically connected to each other (for example, through a metal layer) to be at the same potential, which can drastically increase the trigger current.

Next, structures of various types of possible changes of the transient voltage suppression device 1 of FIG. 1 will be explained. Of course, the structures of the disclosure are not limited thereto.

Figure 2:
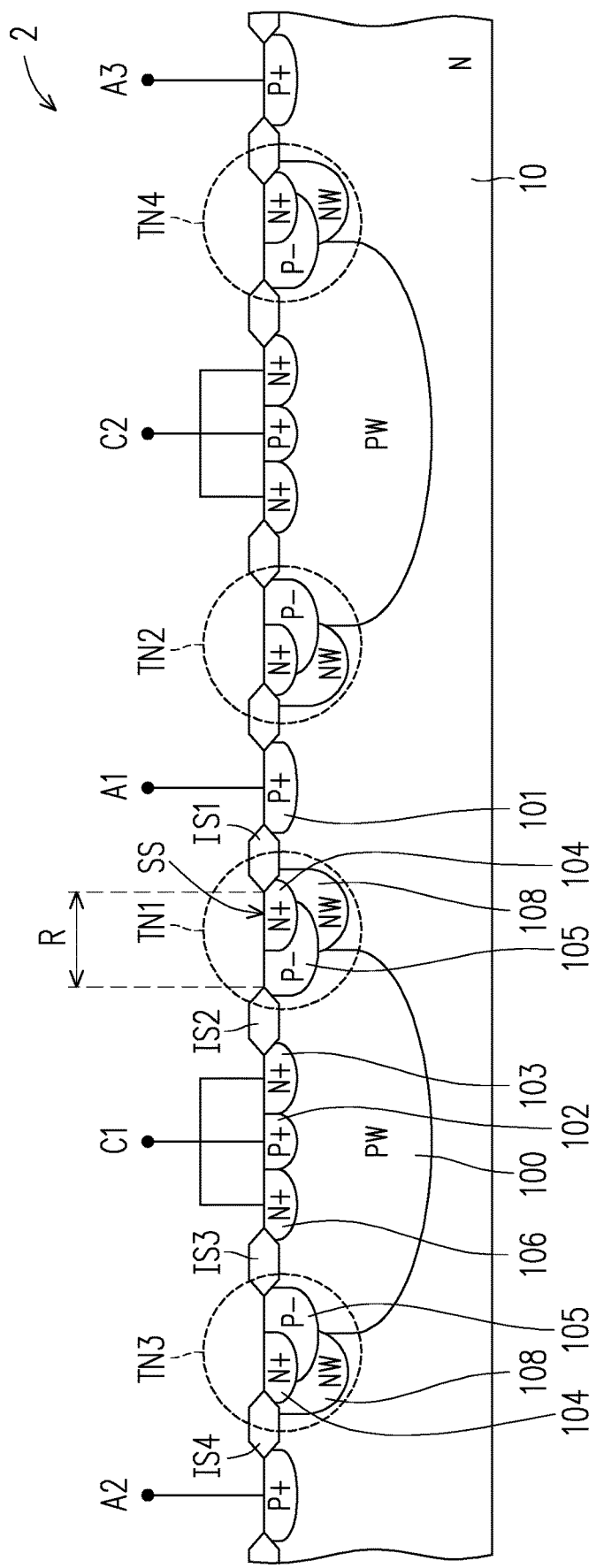

A transient voltage suppression device 2 of FIG. 2 is similar to the transient voltage suppression device 1 of FIG. 1, the difference is that the first trigger node TN1 of the transient voltage suppression device 2 further includes a second well 108 of the first conductivity type (for example, N-type). In an embodiment, the second well 108 is disposed in the substrate 10 below the fourth doped region 104. More specifically, the second well 108 is in physical contact with both the fourth doped region 104 and the fifth doped region 105.

In the transient voltage suppression device 2, the second doped region 102 (such as N+ doped region) and the second well 108 (such as N-type well) of the first trigger node TN1 may further improve the degree of isolation between the first anode A1 (such as P+ doped region) and the first well 100 (such as P-type well) to prevent the punch through phenomenon between the first well 100 and the first anode A1, which can reduce the distance between the first anode A1 and the first well 100, so as to reduce the device area. In the embodiment, the second well 108 and the first well 100 is are contact, but the disclosure is not limited thereto.

Figure 3:
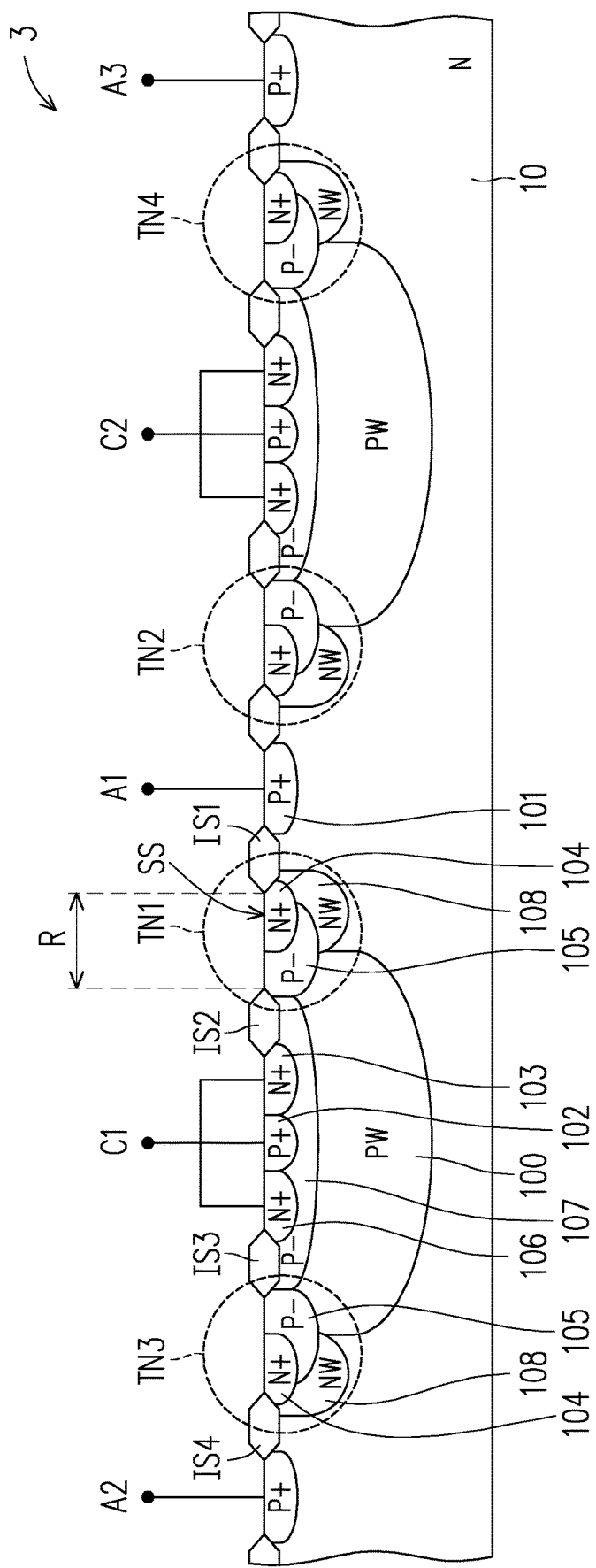

A transient voltage suppression device 3 of FIG. 3 is similar to the transient voltage suppression device 2 of FIG. 2, the difference is that the first cathode C1 of the transient voltage suppression device 3 further includes a seventh doped region 107 of the second conductivity type (for example, P-type). The seventh doped region 107 is a light doped region. In an embodiment, the seventh doped region 107 is disposed below the second doped region 102, the third doped region 103, and the sixth doped region 106. In an embodiment, a doping concentration of the seventh doped region 107 is between a doping concentration of the first well 100 and a doping concentration of the second doped region 102. In the embodiment, the seventh doped region 107 and the fifth doped region 105 are in contact, but the disclosure is not limited thereto.

In the transient voltage suppression device 3, the seventh doped region 107 (such as P− doped region) of the first cathode C1 is connected to the fifth doped region 105 (such as P− doped region) of the first trigger node TN1, which can further reduce the on resistance (Ron) of the device and increase the trigger current.

Figure 4:
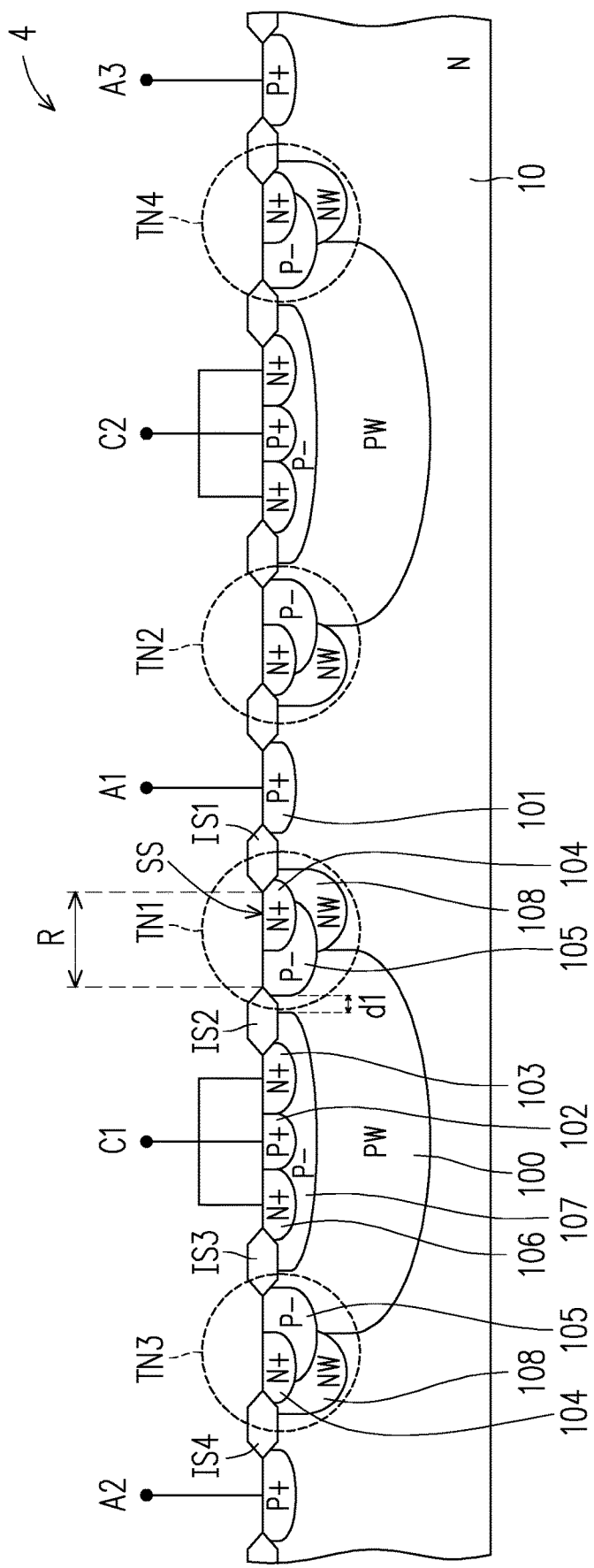

A transient voltage suppression device 4 of FIG. 4 is similar to the transient voltage suppression device 3 of FIG. 3, the difference is that the seventh doped region 107 and the fifth doped region 105 of the transient voltage suppression device 4 are separated by a distance d1.

Figure 5:
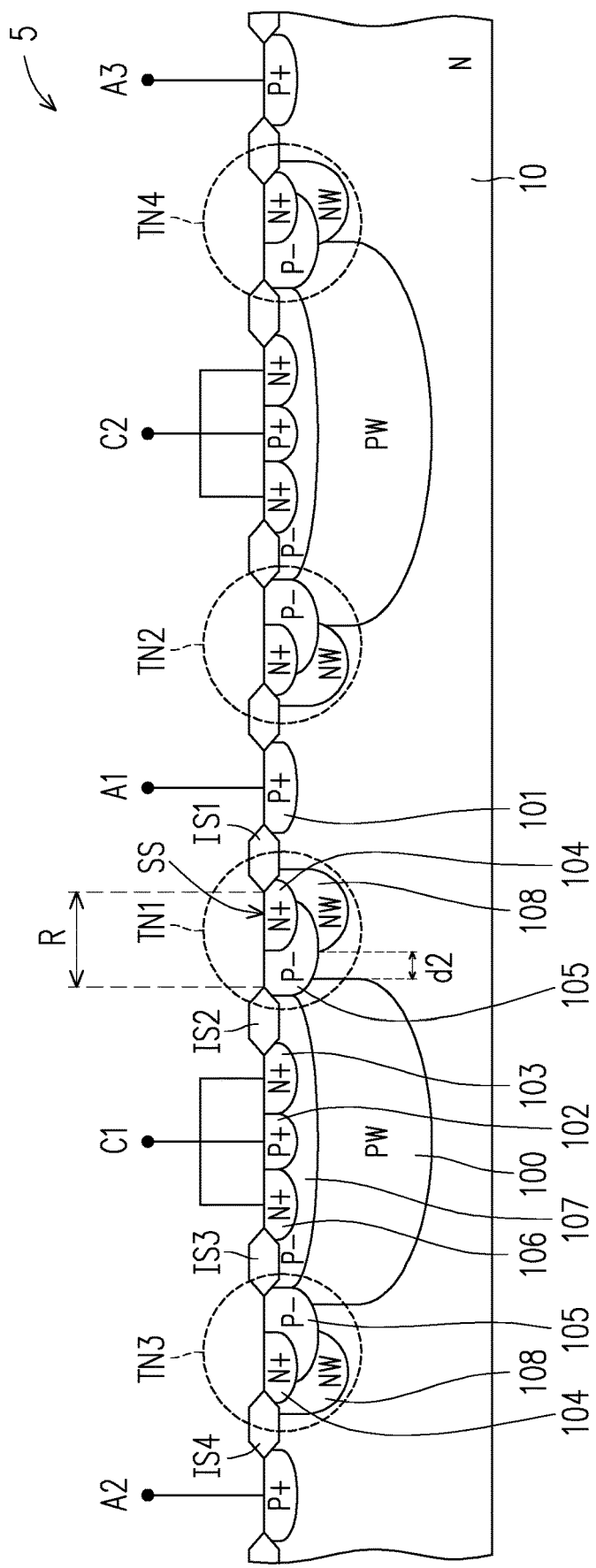

A transient voltage suppression device 5 of FIG. 5 is similar to the transient voltage suppression device 3 of FIG. 3, the difference is that the second well 108 and the first well 100 of the transient voltage suppression device 5 may be separated by a distance d2.

Figure 6:
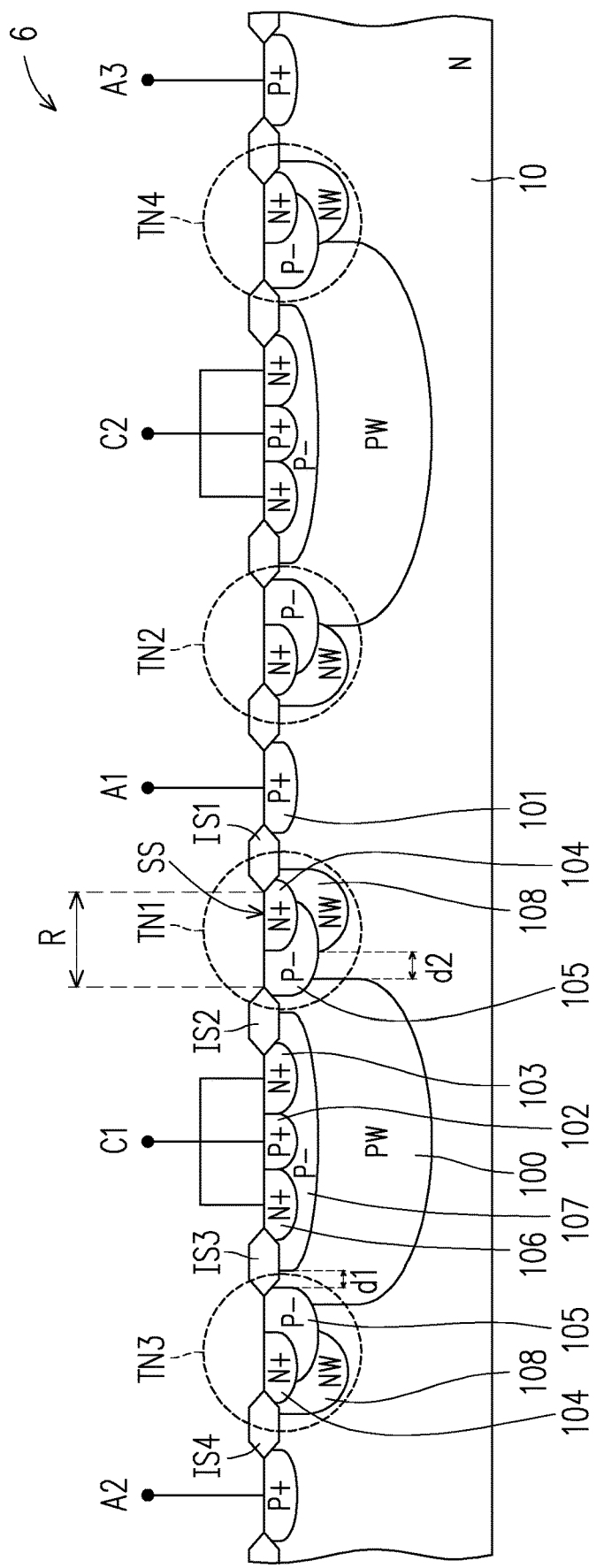

A transient voltage suppression device 6 of FIG. 6 is similar to the transient voltage suppression device 3 of FIG. 3, the difference is that the seventh doped region 107 and the fifth doped region 105 of the transient voltage suppression device 6 are separated by the distance d1, and the second well 108 and the first well 100 may be separated by the distance d2.

Figure 7:
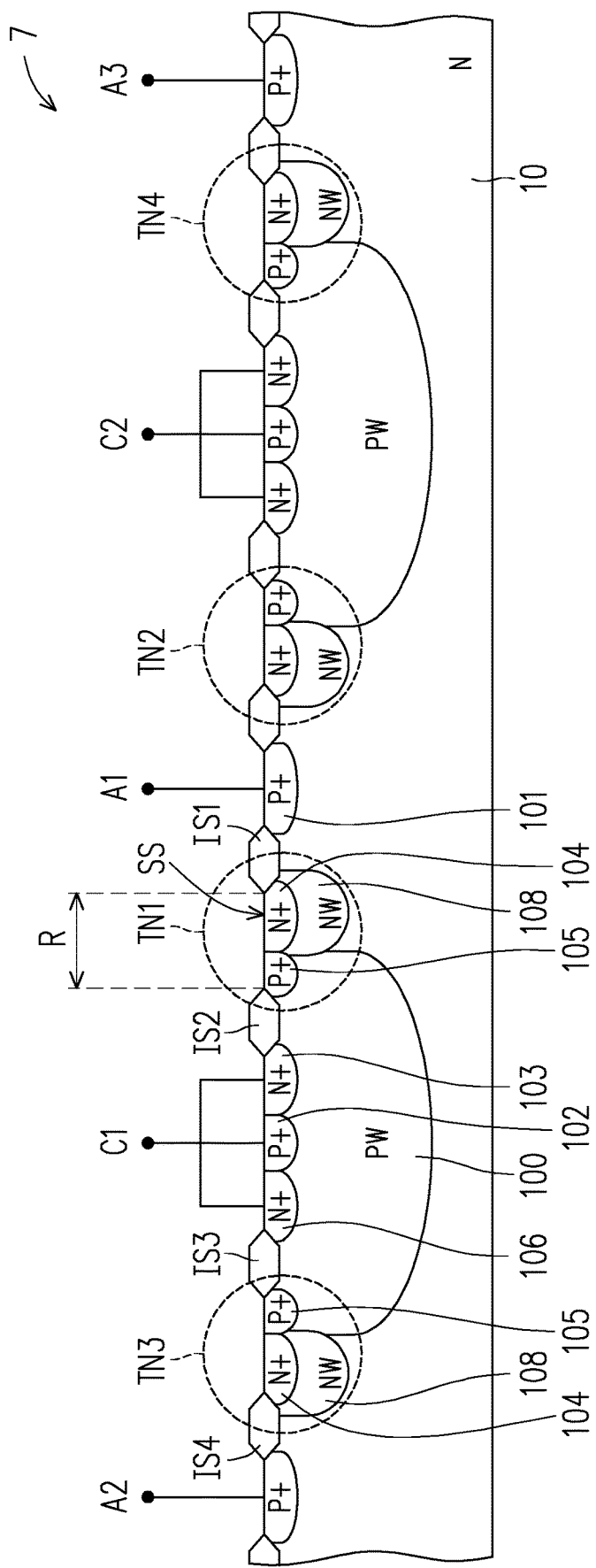

A transient voltage suppression device 7 of FIG. 7 is similar to the transient voltage suppression device 2 of FIG. 2, the difference is that the fifth doped region 105 of the transient voltage suppression device 7 is a heavy doped region while the fifth doped region 105 of the transient voltage suppression device 2 is a light doped region. More specifically, the fifth doped region 105 and the fourth doped region 104 of the transient voltage suppression device 7 are adjacent, but do not extend below the fourth doped region 104. In the embodiment, increasing the doping concentration of the fifth doped region 105 can change the breakdown voltage.

Figure 8:
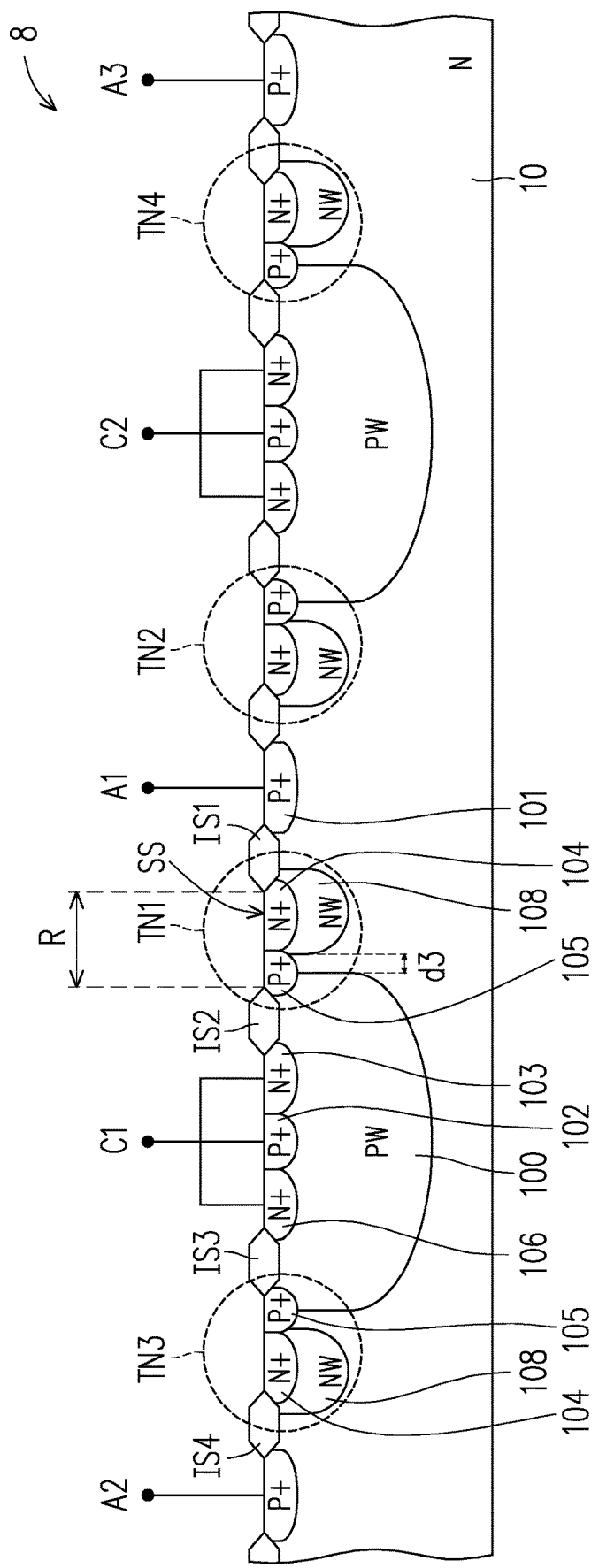
Figure 9:
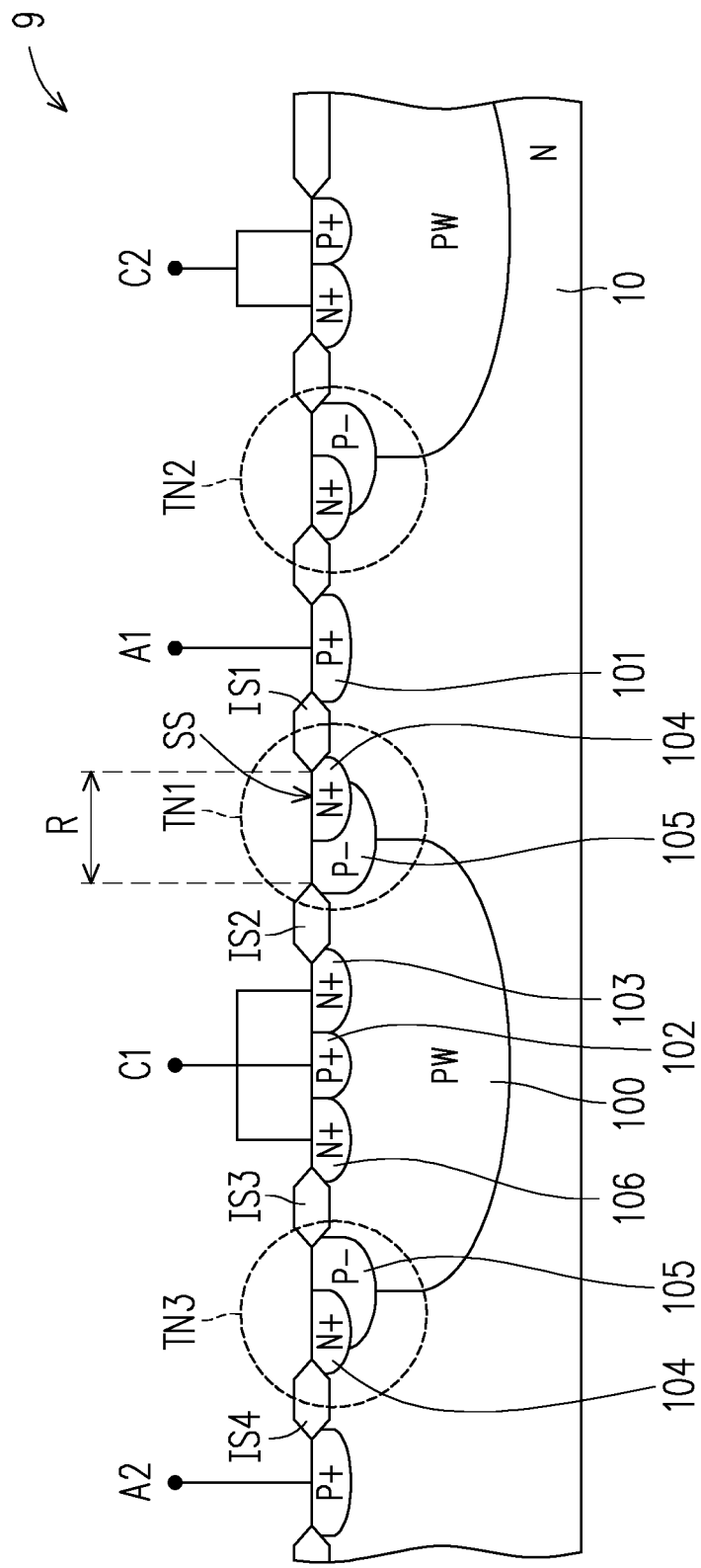
FIG. 9 to FIG. 16 are cross-sectional views of various types of transient voltage suppression devices according to alternative embodiments of the disclosure.
Figure 10:
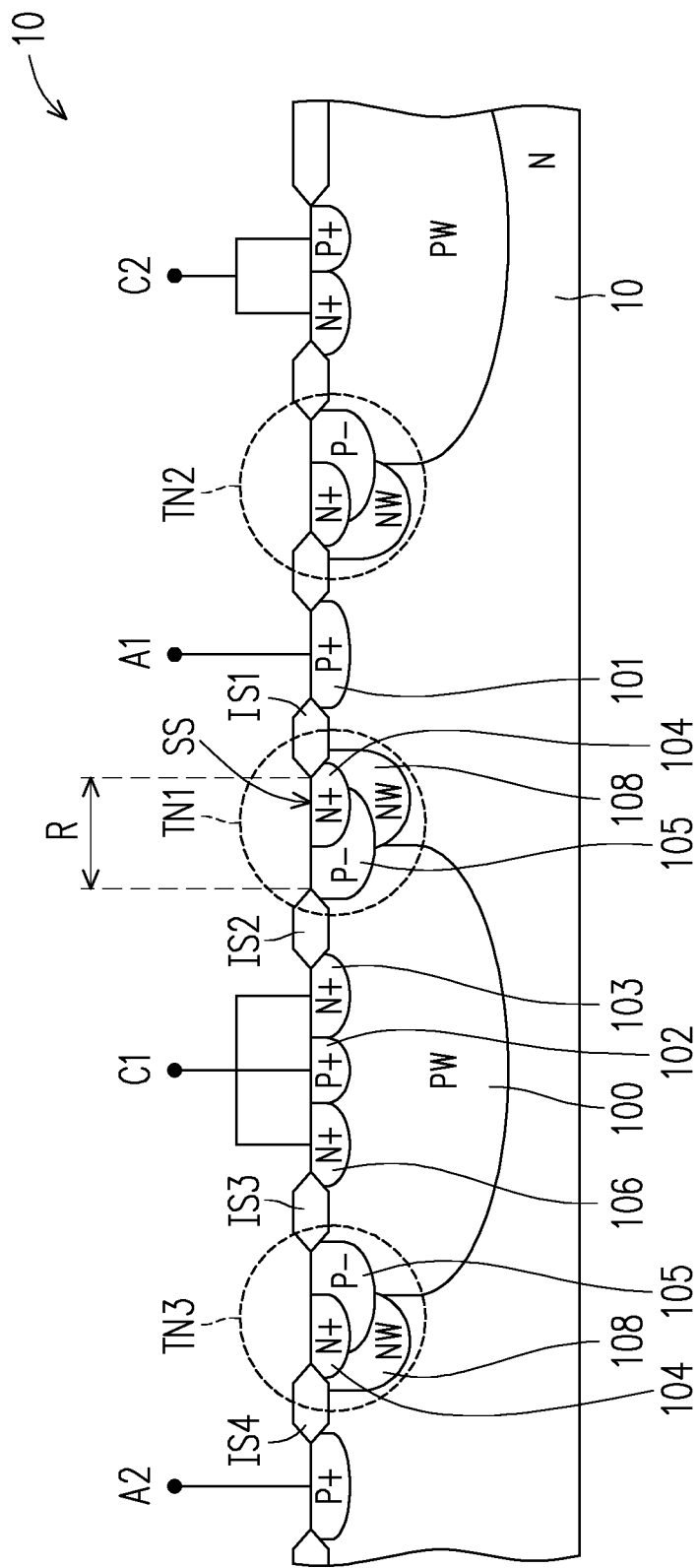
Figure 11:
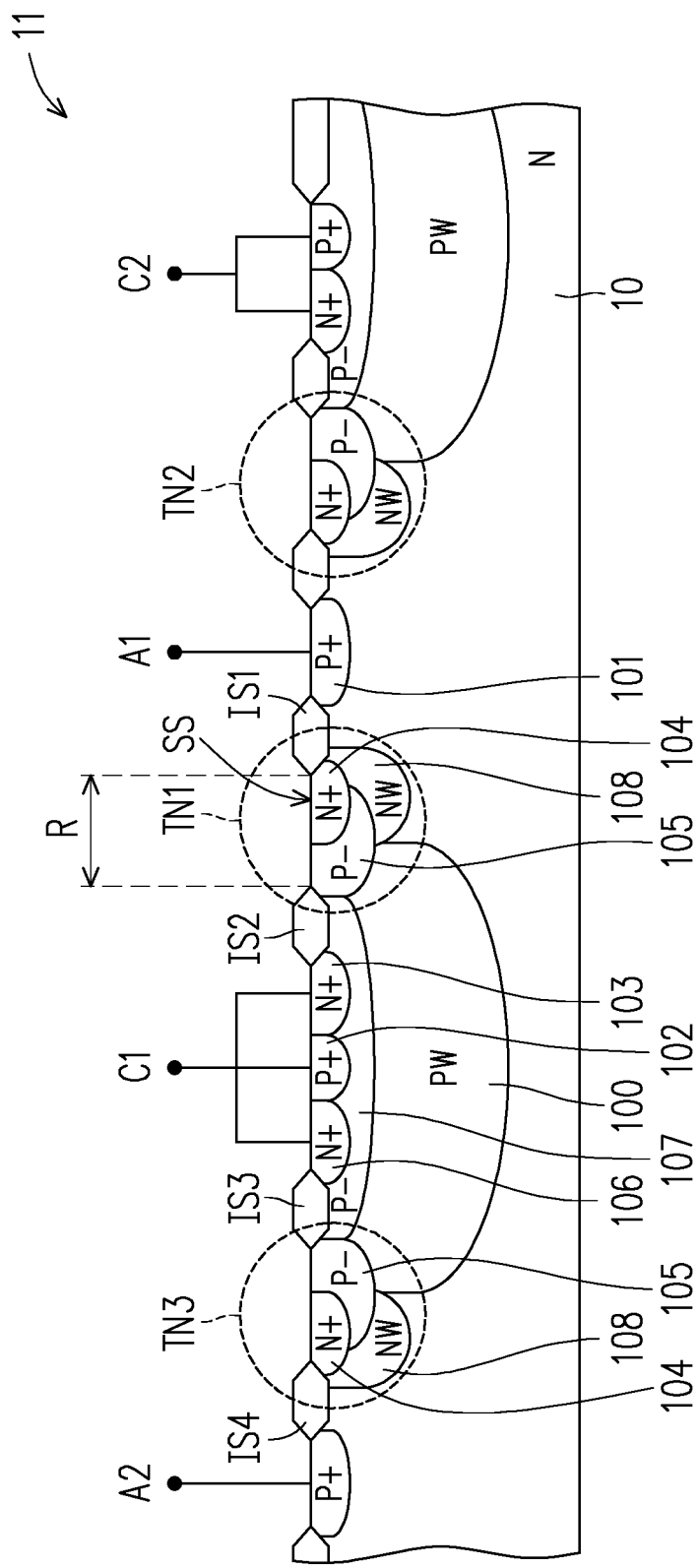
Figure 12:
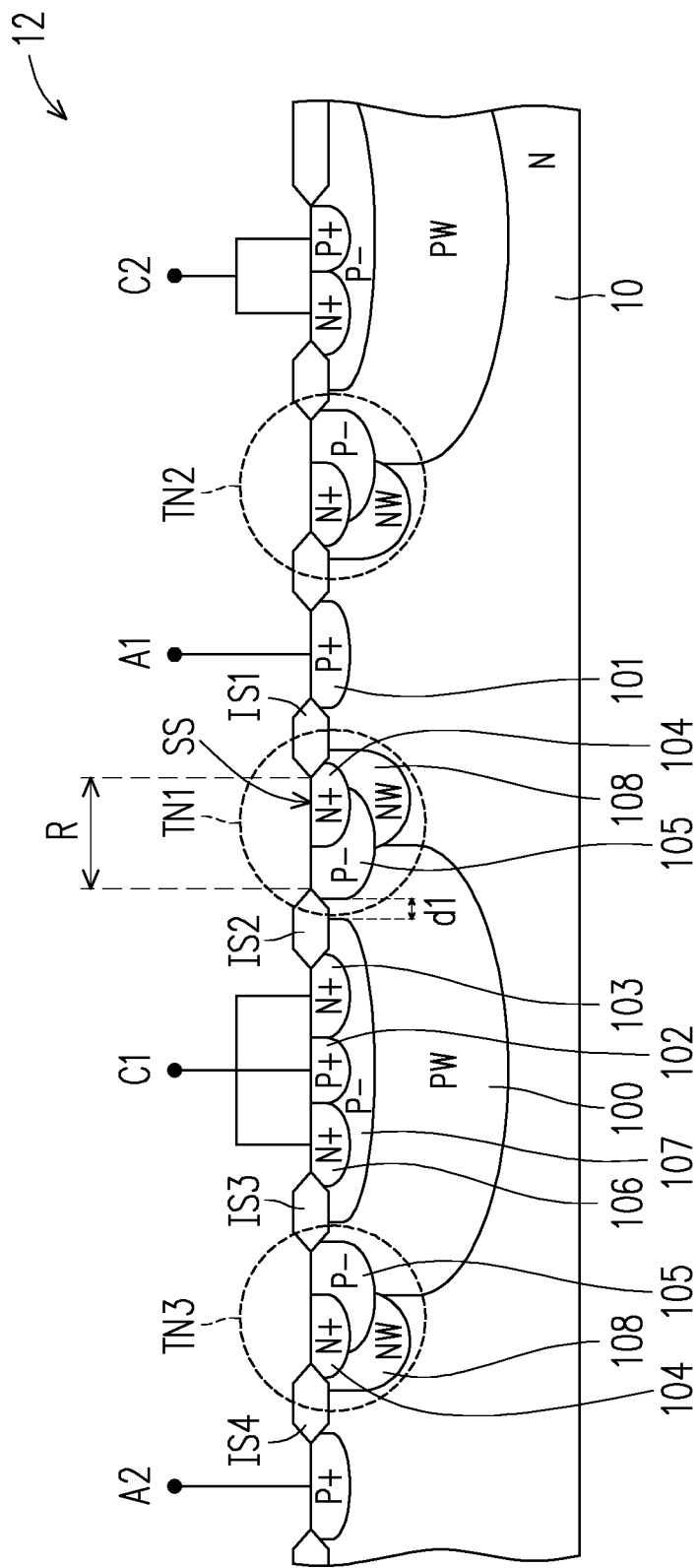
Figure 13:
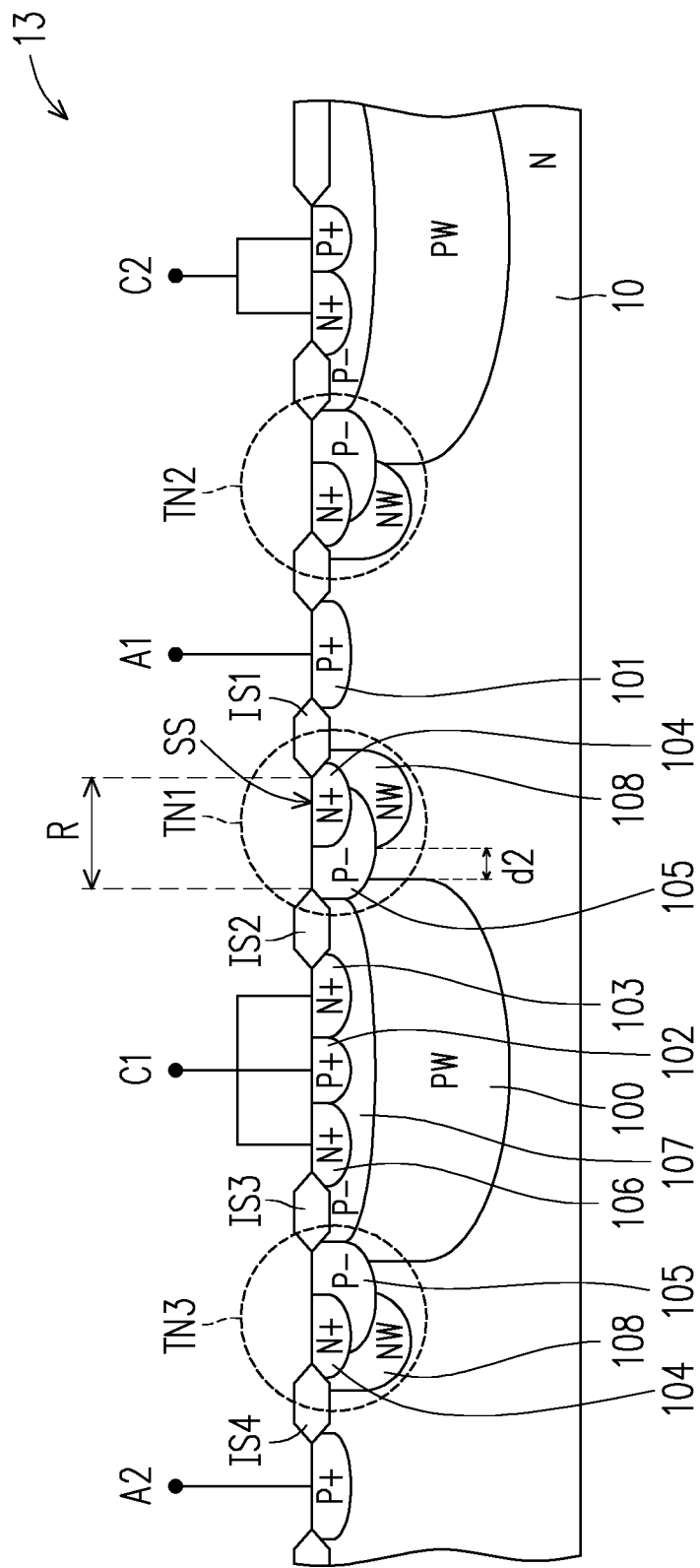
Figure 14:
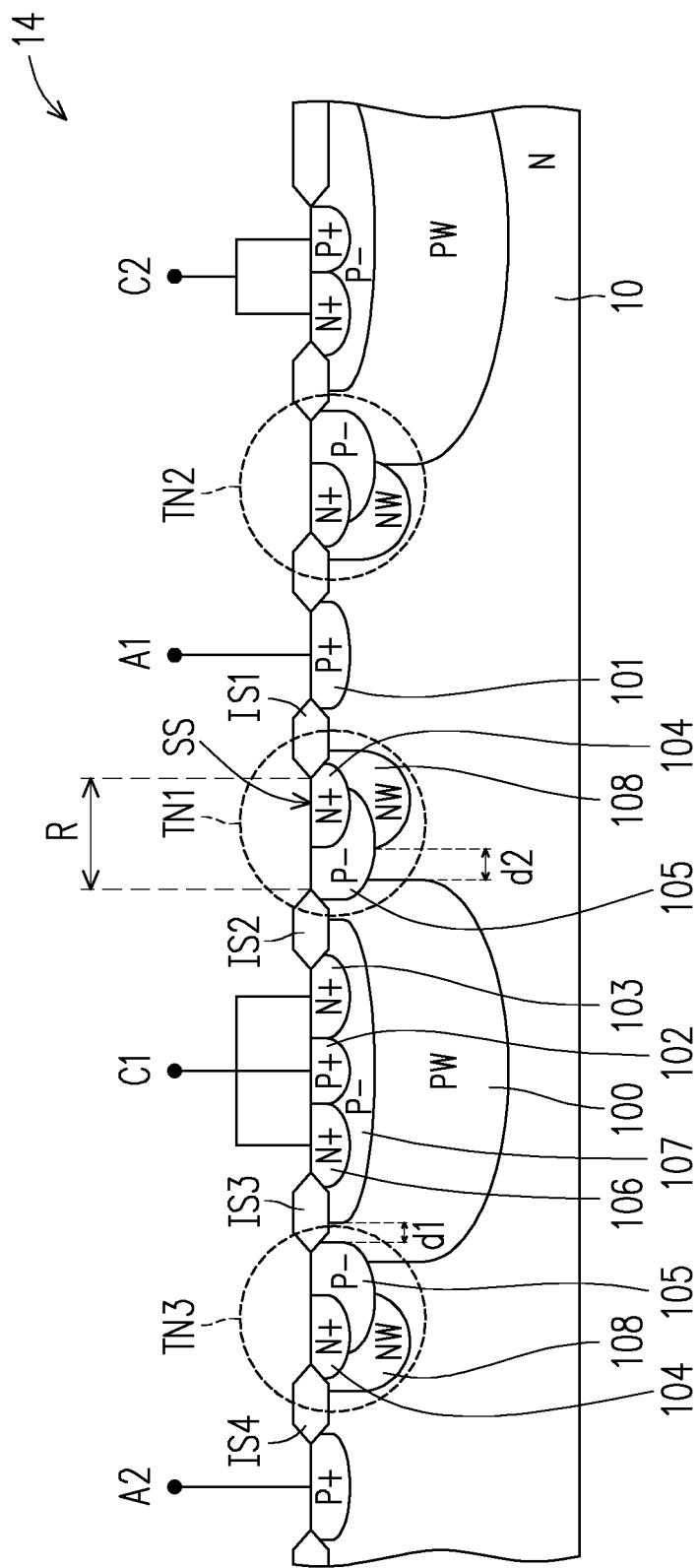
Figure 15:
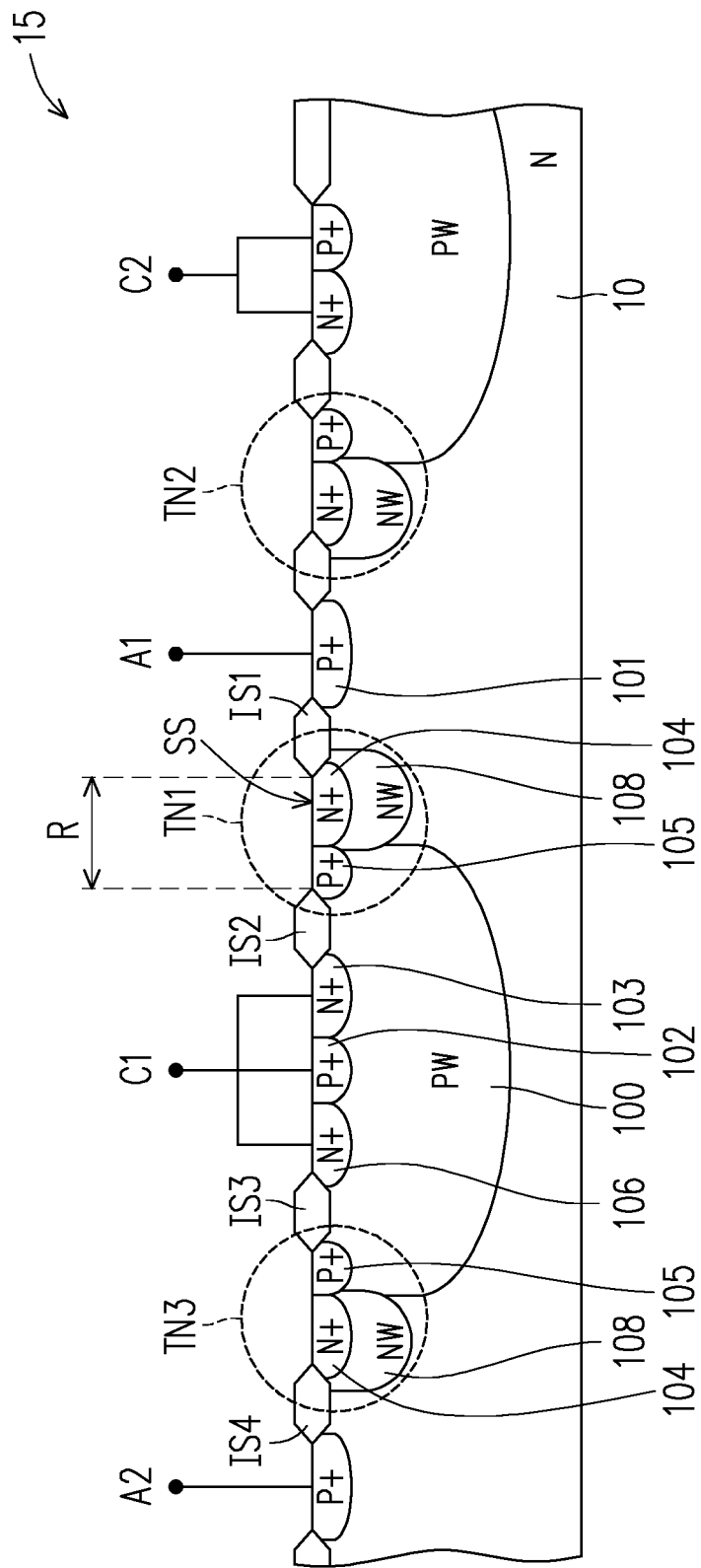
Figure 16:
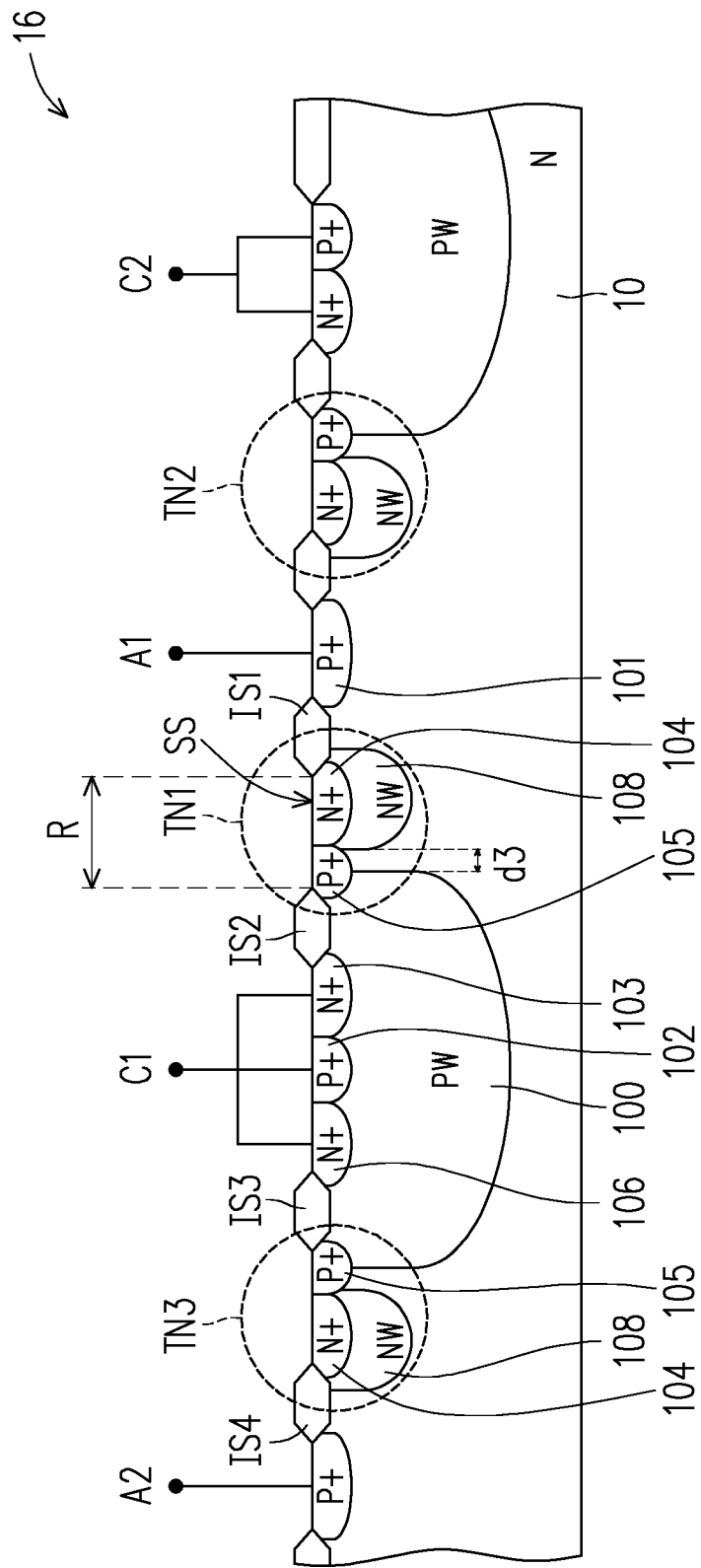

A transient voltage suppression device 8 of FIG. 8 is similar to the transient voltage suppression device 7 of FIG. 7, the difference is that the second well 108 and the first well 100 of the transient voltage suppression device 8 are separated by a distance d3 while the second well 108 and the first well 100 of the transient voltage suppression device 7 are in contact with each other.

FIG. 9 to FIG. 16 are cross-sectional views of various types of transient voltage suppression devices according to alternative embodiments of the disclosure.

Transient voltage suppression devices 9 to 16 of FIG. 9 to FIG. 16 are similar to the transient voltage suppression devices 1 to 8 of FIG. 1 to FIG. 8, the difference is that when the first anode A1 is the center, the transient voltage suppression devices 9 to 16 are not mirror-symmetrical while the transient voltage suppression devices 1 to 8 are mirror-symmetrical.

In an embodiment, when the first anode A1 is the center, the second cathode C2 and the first cathode C1 are not mirror-symmetrical. More specifically, in the transient voltage suppression devices 9 to 16, the first cathode C1 on the left is close to a center region of the device and the second cathode C2 on the right is close to a periphery region of the device. Therefore, the first cathode C1 on the left needs to be configured with the sixth doped region 106 and the second cathode C2 on the right does not need to be configured with the sixth doped region 106. In the embodiment, the second cathode C2 on the right includes only the second doped region 102 and the third doped region 103 in contact with each other and having the same potential.

When viewing from another perspective, the transient voltage suppression devices 9 to 16 are mirror structures with the second doped region 102 as the central axis, the third trigger node TN3 and the first trigger node TN1 are mirror-symmetrical, and the second anode A2 and the first anode A1 are mirror-symmetrical.

Based on the above, in the transient voltage suppression devices of the disclosure, the doped regions at the cathode are N+/P+/N+ junction structures of the same diffusion region and have the same potential to increase the trigger current. Compared with the conventional structure in which the field oxide layer is used to separate the doped regions at the cathode to different diffusion regions, the area occupied according to the disclosure is relatively small and the electrostatic discharge tolerance can be effectively improved. At the same time, there is a doped region structure below the trigger node to improve the degree of isolation between the anode and the cathode, which can reduce the design area and increase the device density per unit area, thereby effectively reducing the on resistance (Ron) of the device. In addition, the doped region structures of the trigger node are all in the same diffusion region and there is the N/P junction formed by the N doped region and the P doped region. Therefore, the breakdown voltage or the trigger voltage may be adjusted by changing only the doping concentration of the P doped region, which can reduce the design complexity. In addition, the anode is the P+/N-sub junction and due to the low concentration of N-sub, the depletion region between N-sub and P+ is enlarged, which can reduce the junction capacitance.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transient voltage suppression device, comprising:
   a substrate of a first conductivity type;
   a first well of a second conductivity type, disposed in the substrate;
   a first anode, disposed in the substrate outside the first well and comprising a first doped region of the second conductivity type;
   a first cathode, disposed in the first well and comprising:
     a second doped region of the second conductivity type; and
     a third doped region of the first conductivity type, disposed between the second doped region and the first doped region; and
   a first trigger node, disposed between the first anode and the first cathode, and comprising:
     a fourth doped region of the first conductivity type, disposed in the substrate; and
     a fifth doped region of the second conductivity type, at least partially disposed in the first well and disposed between the fourth doped region and the third doped region.

2. The transient voltage suppression device according to claim 1, wherein the first trigger node is electrically floating.

3. The transient voltage suppression device according to claim 1, wherein the fourth doped region and the fifth doped region are in a same diffusion region and are adjacent to a surface of the substrate.

4. The transient voltage suppression device according to claim 1, wherein a doping concentration of the fourth doped region is greater than or equal to a doping concentration of the fifth doped region.

5. The transient voltage suppression device according to claim 1, wherein a portion of the fourth doped region is disposed in the fifth doped region.

6. The transient voltage suppression device according to claim 1, wherein the first cathode further comprises a sixth doped region of the first conductivity type, and the second doped region is disposed between the sixth doped region and the third doped region.

7. The transient voltage suppression device according to claim 1, wherein the first cathode further comprises a seventh doped region of the second conductivity type, and the seventh doped region is disposed below the second doped region and the third doped region.

8. The transient voltage suppression device according to claim 7, wherein a doping concentration of the seventh doped region is between a doping concentration of the first well and a doping concentration of the second doped region.

9. The transient voltage suppression device according to claim 7, wherein the seventh doped region and the fifth doped region are in contact.

10. The transient voltage suppression device according to claim 7, wherein the seventh doped region and the fifth doped region are separated by a distance.

11. The transient voltage suppression device according to claim 1, wherein the first trigger node further comprises a second well of the first conductivity type, disposed in the substrate below the fourth doped region.

12. The transient voltage suppression device according to claim 11, wherein the second well and the first well are in contact.

13. The transient voltage suppression device according to claim 11, wherein the second well and the first well are separated by a distance.

14. The transient voltage suppression device according to claim 1, wherein the second doped region and the third doped region are in contact and are at a same potential.

15. The transient voltage suppression device according to claim 1, wherein the transient voltage suppression device is a mirror structure with the first doped region or the second doped region as a central axis.

* * * * *